United States Patent
Park et al.

(10) Patent No.: US 6,218,227 B1
(45) Date of Patent: Apr. 17, 2001

(54) METHOD TO GENERATE A MONOS TYPE FLASH CELL USING POLYCRYSTALLINE SILICON AS AN ONO TOP LAYER

(75) Inventors: Steven K. Park, Cupertino; Arvind Halliyal, Sunnyvale; Hideki Komori, Santa Clara, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/426,239

(22) Filed: Oct. 25, 1999

(51) Int. Cl.[7] .............................................. H01L 21/8238
(52) U.S. Cl. ......................... 438/216; 438/261; 438/287
(58) Field of Search ................................... 438/216, 258, 438/261, 287; 257/324, 411

(56) References Cited

U.S. PATENT DOCUMENTS

| | | | |
|---|---|---|---|
| 5,120,670 | * 6/1992 | Bergmont | 438/261 |
| 5,304,503 | * 4/1994 | Yoon et al. | 438/258 |
| 5,397,725 | * 3/1995 | Wostenholme et al. | 438/261 |
| 5,683,923 | * 11/1997 | Shimizu et al. | 438/287 |
| 5,700,728 | * 12/1997 | Kuo et al. | 438/216 |
| 5,960,289 | * 9/1999 | Tsui et al. | 438/275 |
| 5,966,603 | * 10/1999 | Eitan | 438/258 |
| 6,063,666 | * 5/2000 | Chang et al. | 438/261 |

\* cited by examiner

*Primary Examiner*—T. N. Quach
(74) *Attorney, Agent, or Firm*—Brinks Gofer Gilson & Lione

(57) ABSTRACT

A process for fabricating an ONO structure for a MONOS type Flash cell includes growing a first silicon oxide layer over a semiconductor substrate. Thereafter, a silicon nitride layer is formed to overlie the first silicon oxide layer, and a polycrystalline silicon layer is deposited to overlie the silicon nitride layer. By utilizing the polycrystalline silicon layer as the top layer of the ONO structure, a resist layer can be cleaned more aggressively than if the top layer of the ONO structure were an oxide layer. A second silicon oxide layer overlies the polycrystalline layer, of the ONO structure. Since the second silicon oxide layer is deposited on top of polycrystalline silicon after the resist material is cleaned, some resist material can remain on the polycrystalline layer without degrading the performance of the MONOS type cell.

17 Claims, 1 Drawing Sheet

US 6,218,227 B1

METHOD TO GENERATE A MONOS TYPE FLASH CELL USING POLYCRYSTALLINE SILICON AS AN ONO TOP LAYER

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,255. "METHOD OF USING SOURCE/DRAIN NITRIDE FOR PERIPHERY FIELD OXIDE AND BIT-LINE OXIDE".

U.S. patent application Ser. No. 09/426,672. "HIGH TEMPERATURE OXIDE DEPOSITION PROCESS FOR FABRICATING AN ONO FLOATINGGATE ELECTRODE IN A TWO-BIT EEPROM DEVICE".

U.S. patent application Ser. No. 09/433,041. "PROCESS FOR FABRICATING AN ONO STRUCTURE HAVING A SILICON-RICH SILICON NITRIDE LAYER,".

U.S. patent application Ser. No. 09/426,240. "PROCESS FOR FABRICATING AN ONO FLOATING-GATE ELECTRODE IN A TWO-BIT EEPROM DEVICE USING RAPID-THERMAL-CHEMICAL-VAPORDEPOSITION".

U.S. patent application Ser. No. 09/433,186. "PROCESS FOR FABRICATING AN ONO STRUCTURE".

U.S. patent application Ser. No. 09/433,037. "NITRIDATION PROCESS FOR FABRICATING AN ONO FLOATING-GATE ELECTRODE IN A TWO-BIT EEPROM DEVICE".

U.S. patent application Ser. No. 09/426,430. "METHOD OF FABRICATING AN ONO DIELECTRIC BY NITRIDATION FOR MNOS MEMORY CELLS".

FIELD OF THE INVENTION

The invention relates generally to the fabrication of semiconductor devices and, more particularly, to the fabrication of the dielectric layers in semiconductor devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other nonvolatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain.

A Flash device that utilizes the ONO structure is a Metal-Oxide-Nitride-Oxide-Silicon (MONOS) type cell. The MONOS type cell includes a bit-line, a second and an ONO structure which function together to determine the location of the bit stored in memory. Important factors towards achieving high performance of the MONOS type cell include the quality and cleanliness of the ONO structure.

A problem exists with known MONOS fabrication techniques in that the quality and cleanliness of the ONO structure cannot be guaranteed during the fabrication process of the transistor. One reason that these factors cannot be guaranteed is that during production of the MONOS type cell, the ONO layer is subjected to repeated photoresist coatings and cleanings. For example, a resist layer is formed on the ONO structure to protect the device during boron and arsenic implants that underlie the bit-line. After the boron and arsenic are implanted, typically ashing and a wet clean are used to remove the resist layer. Thereafter, to form other parts of the transistor, additional photoresist coatings and cleanings are performed on the ONO structure.

To effectively remove the resist layer, the top oxide layer should be aggressively cleaned so that an organic residue of the resist-material does not contaminate the top oxide of the ONO structure. Resist material remaining on the top oxide layer of the ONO structure can adversely affect the connection between the top oxide layer and an overlying polycrystalline silicon layer of the MONOS cell which degrades performance of the cell. According to known MONOS type cell structures, however, cleaning cannot be accomplished with an aggressive acid, such as hydrofluoric acid, since the aggressive acid can degrade the top oxide layer of the ONO structure.

In sum, while there have been recent advances in EEPROM technology, numerous challenges exist in the fabrication of these devices. In particular, there is a need for an improved method of generating a MONOS type Flash cell and EEPROM technology that allows for aggressive cleaning of a top layer of the ONO structure. In addition, the improved method should ensure a high quality ONO structure, e.g., one that can withstand multiple photresist coatings and cleanings without degrading a top layer of the ONO structure.

BRIEF SUMMARY OF THE INVENTION

Such needs are met or exceeded by the present method for fabricating a MONOS type cell. The MONOS type cell includes an ONO structure that can be aggressively cleaned after a photoresist process is performed and still maintain a high quality, e.g., a sufficient thickness.

More specifically, in one form, a process for fabricating an ONO structure for a MONOS type cell includes growing a silicon oxide layer over a semiconductor substrate. Thereafter, a silicon nitride layer is formed to overlie the silicon oxide layer, and a polycrystalline silicon layer is deposited to overlie the silicon nitride layer. By utilizing the polycrystalline silicon layer as the top layer of the ONO structure, a resist layer can be cleaned more aggressively than if the top layer of the ONO structure were an oxide layer. A second silicon oxide layer overlies the polycrystalline layer. Since the second silicon oxide layer is deposited on top of polycrystalline silicon after the resist layer is removed, some resist material can remain on the polycrystalline layer without degrading the performance of the MONOS type cell.

BRIEF DESCRIPTION OF THE DRAWINGS

Other features and advantages of the invention will be apparent to those skilled in the art with reference to the detailed description and the drawings, of which.

Figure 1:
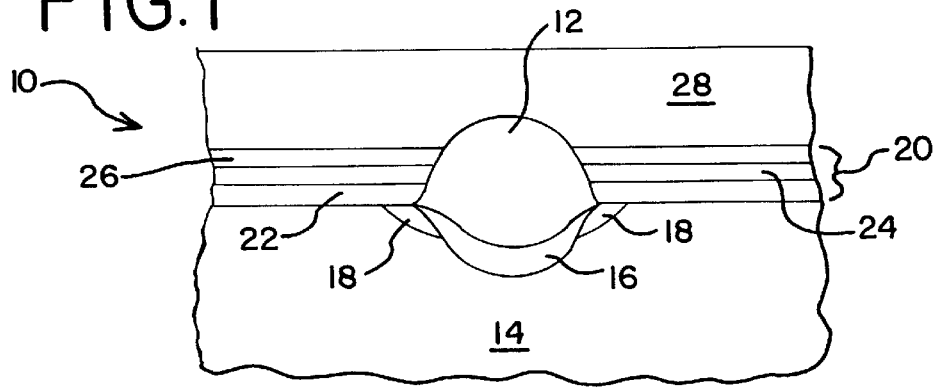
FIG. 1 illustrates, in cross-section, a portion of a semiconductor substrate containing a MONOS type transistor that incorporates an ONO structure fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

Shown in FIG. 1, in cross-section, is a transistor 10 suitable for use in EEPROM and Flash type devices. Transistor 10 includes at least one bit-line oxide region 12 located in a semiconductor substrate 14. Bit-line oxide region 12 overlies an implanted arsenic region 16 and boron regions 18. Overlying semiconductor substrate 14 is an ONO structure 20. ONO structure 20 includes a first silicon oxide layer 22 directly overlying semiconductor substrate 14. A silicon nitride layer 24 overlies first silicon oxide layer 22. A polycrystalline silicon layer 26 overlies silicon nitride layer 24, and a second silicon oxide layer 28 overlies the polycrystalline silicon layer 26 and the bit-line region 12.

Those skilled in the art will recognize that the proper functioning of a MONOS Flash cell device necessarily requires that an electrical charge remain isolated in the regions of silicon nitride layer 24 to which it is initially introduced. In particular, the quality of ONO structure 20 must be such that charge leakage paths are minimized at the interface between the silicon oxide layers and silicon nitride layer.

In accordance with the invention, charge leakage within ONO structure 20 is minimized by forming a high quality ONO structure 20. The reduced charge leakage obtained by the present invention can be better understood following a description of an MONOS fabrication process carried out in accordance with the invention.

Figure 2:
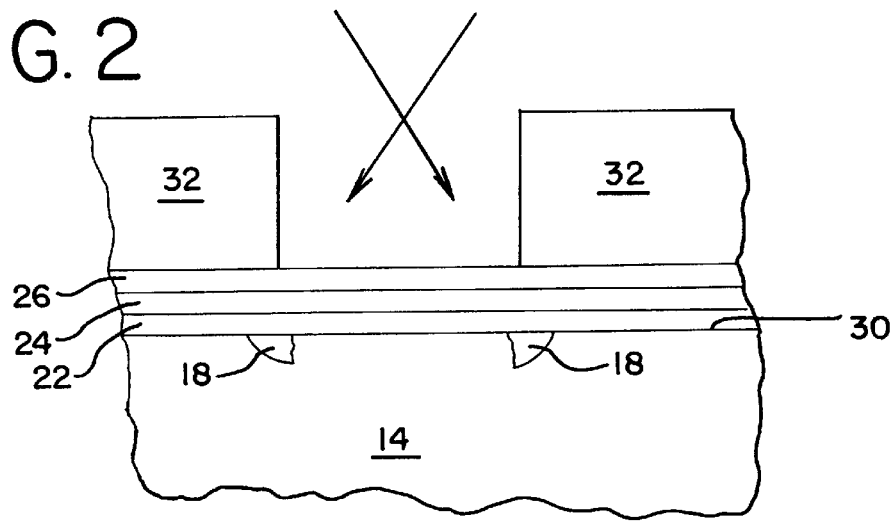
FIGS. 2 and 3 illustrate, in cross-section, process steps for the fabrication of an ONO structure in accordance with the invention.

Referring to FIG. 2, first silicon oxide layer 22 is formed to overlie the surface of semiconductor substrate 14. Preferably, semiconductor substrate 14 is a single crystal silicon substrate. Semiconductor substrate 14 has an upper surface 30 previously processed to remove debris and native oxides. Preferably, first silicon oxide layer 22 is formed by thermally oxidizing surface 30 at an elevated temperature in the presence of dry molecular oxygen. Preferably, the oxidation process is carried out at a temperature of about 1000 to about 1500° C. The oxidation process forms a silicon oxide layer preferably having a thickness of about 50 to about 150 angstroms, and more preferably a thickness of about 100 angstroms. The oxidation process can be carried out in either a batch-type thermal oxidation furnace, or alternatively, in a single-wafer oxidation apparatus.

After forming the first silicon oxide layer 22, the silicon nitride layer 24 is formed to overlie the first silicon oxide layer 22. For example, silicon nitride layer 24 is formed by means of a rapid-thermal-chemical-vapor-deposition (RTCVD) process. The RTCVD process is carried out at a temperature of about 700 to about 800° C. The process is carried out for a period of time and at gas flow rates sufficient to form a silicon nitride layer preferably having a thickness of about 50 to about 100 angstroms. Those skilled in the art will appreciate that other processes can be used.

According to an aspect of the present invention, after forming the silicon nitride layer 24, the polycrystalline silicon layer 26 is formed to overlie the silicon nitride layer 24. For example, first the polycrystalline silicon layer 26 is formed by means of RTCVD. The RTCVD process is carried out at a temperature of about 500 to about 700° C. and for a period of time sufficient to form polycrystalline silicon preferably having a thickness of about 20 to about 500 angstroms, and more preferably about 50 to 150 angstroms. Those skilled in the art will appreciate that other processes can be used to form the polycrystalline silicon layer 26, such as a low-pressure-chemical-vapor-deposition (LPCVD) process.

After the polycrystalline silicon layer 26 is formed the bit-line is masked, for example, with a photoresist process which produces a resist layer 32. Thereafter, a boron implant is performed at large angles to form the boron regions 18. After the boron regions 18 are formed, a bit-line etch is performed which removes the polycrystalline silicon layer 26 and the nitride layer 24 from the bit-line area.

Figure 3:
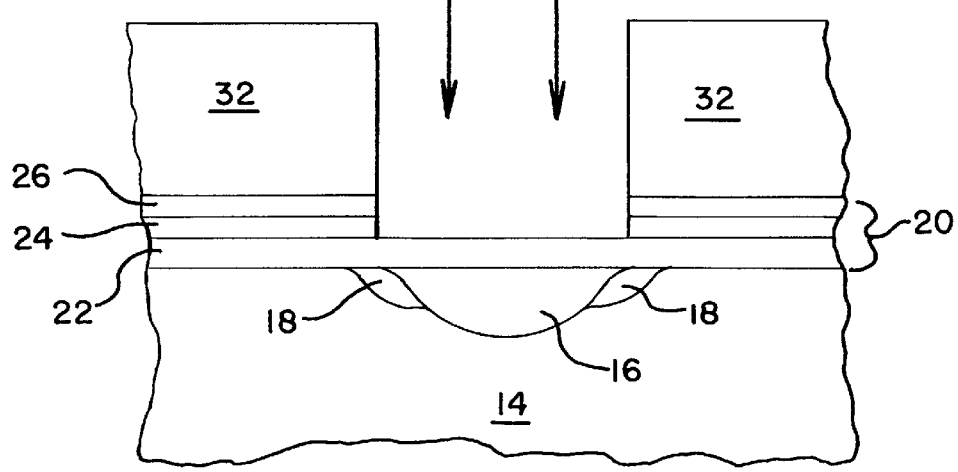

Referring to FIG. 3, after the bit-line etch, arsenic is implanted at small angles to form the arsenic region 16. Thereafter, the resist layer 32 is removed. Because a top layer of the ONO structure 20 is the polycrystalline silicon layer 26, the resist material may be removed aggressively with hydrofluoric acid, for example. Moreover, the degree of cleanliness of the polycrystalline silicon layer 26 is not as important since the second silicon oxide layer 28 is grown to overlie the polycrystalline layer 26 after the resist layer 32 is removed.

Referring back to FIG. 1, after the resist layer 32 is removed, dry oxidation is performed to form the second silicon oxide layer 28. Those skilled in the art will appreciate that other types of oxidation processes can be used such as rapid-thermal-oxidation (RTO).

In a preferred embodiment, a furnace oxidation process is performed simultaneously with the second silicon oxide layer 28 dry oxidation process to form the bit-line oxide layer 12. Those skilled in the art will appreciate that other oxidation processes can be use to form the bit-line oxide such as RTO. Alternately, since it may be difficult to control the thickness of both the bit-line oxide layer 12 and the second silicon oxide layer 28, the above described oxidation processes can be performed separately. Finally, since the bit-line oxidation process activates the arsenic, an annealing process is unnecessary.

From the foregoing description, it should be understood that an improved method of generating a MONOS type flash cell has been shown and described which has many desirable attributes and advantages. Since a polycrystalline silicon layer is utilized as the top layer of the ONO structure, a resist layer can be cleaned more aggressively than if the top layer of the ONO structure were an oxide layer. In addition, since a second silicon oxide layer is formed to overlie the polycrystalline layer after the resist layer is removed, some resist material can remain on the polycrystalline layer without degrading the performance of the MONOS type cell.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A process for fabricating an ONO structure for a Flash cell device, the process comprising:
   providing a semiconductor substrate;
   growing a first silicon oxide layer overlying said semiconductor substrate;
   forming a silicon nitride layer overlying said first silicon oxide layer;
   depositing a polycrystalline silicon layer overlying said silicon nitride layer; and
   depositing a mask layer to overlie the polycrystalline silicon for forming at least one bit-line pattern;
   growing a bit-line oxide at said bit-line pattern; and
   growing a second silicon oxide layer to overlie said polycrystalline silicon layer.

2. The process of claim 1, herein said steps of growing said bit-line oxide and growing said second silicon oxide layer are performed simultaneously.

3. The process of claim 1, wherein the step of depositing the polycrystalline silicon layer comprise a chemical-vapor-deposition process to form said polycrystalline silicon layer having a thickness of about 20 to about 500 angstroms.

4. The process of claim 3, wherein said chemical-vapor-deposition process comprises a rapid-thermal-chemical-vapor-deposition process.

5. The process of claim 3, wherein said chemical-vapor-deposition process comprises a low-pressure-chemical-vapor-deposition process.

6. The process of claim 1, wherein the step of forming said silicon nitride layer comprises rapid-thermal-chemical-vapor-deposition to form a said silicon nitride layer having a thickness of about 50 to about 100 angstroms.

7. The process of claim 1, the step of growing said second silicon oxide layer comprises utilizing a dry oxidation process.

8. The process of claim 1, the step of growing said second silicon oxide layer comprises utilizing a rapid-thermal-oxidation process.

9. A process for fabricating a Flash cell device including an ONO structure, the process comprising:
   providing a semiconductor substrate having at least one bit-line oxide layer;
   forming an ONO layer on the substrate surface region by first, thermally growing a first silicon oxide layer on the substrate surface region, second, forming a silicon nitride layer overlying the first silicon oxide layer; third, depositing a polycrystalline silicon layer overlying the silicon nitride layer, and fourth, depositing a mask layer to overlie the polycrystalline silicon for forming at least one bit-line pattern;
   growing a bit-line oxide at said bit-line pattern; and
   growing a second silicon oxide layer to overlie said polycrystalline silicon layer, wherein said growing said bit-line oxide and growing said second silicon oxide layer are performed simultaneously.

10. The process of claim 9, wherein the step of depositing the polycrystalline silicon layer comprises a chemical-vapor-deposition process to form said polycrystalline silicon layer having a thickness of about 20 to about 500 angstroms.

11. The process of claim 10, wherein said chemical-vapor-deposition process comprises a rapid-thermal-chemical-vapor-deposition process.

12. The process of claim 10, wherein said chemical-vapor-deposition process comprises a low-pressure-chemical-vapor-deposition process.

13. The process of claim 9, wherein the step of forming said silicon nitride layer comprises rapid-thermal-chemical-vapor-deposition to form a said silicon nitride layer having a thickness of about 50 to about 100 angstroms.

14. The process of claim 9, the step of growing said second silicon oxide layer comprises utilizing a dry oxidation process.

15. The process of claim 9, the step of growing said second silicon oxide layer comprises utilizing a rapid-thermal-oxidation process.

16. A process for fabricating a structure in a Flash cell device, the process comprising:
   providing a semiconductor substrate having a silicon surface region;
   growing a first silicon oxide layer overlying the surface region;
   depositing a silicon nitride layer overlying the first silicon oxide layer;
   growing a polycrystalline silicon layer overlying said silicon nitride layer, wherein said growing of said polycrystalline silicon is carried out by a chemical-vapor-deposition process;
   depositing a mask layer to overlie said polycrystalline silicon for forming at least one bit-line pattern;
   growing a bit-line oxide at said bit-line pattern; and
   growing a second silicon oxide layer to overlie said polycrystalline silicon layer.

17. The process of claim 16, wherein said steps of growing said bit-line oxide and growing said second silicon oxide layer are performed simultaneously.

* * * * *